(12) United States Patent
Takeda et al.

(10) Patent No.: US 7,116,592 B2
(45) Date of Patent: Oct. 3, 2006

(54) SEMICONDUCTOR DEVICE AND TEST METHOD THEREOF

(75) Inventors: Shinji Takeda, Yokohama (JP); Yoshiharu Hirata, Yokohama (JP); Naokazu Kuzuno, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/130,141

(22) Filed: May 17, 2005

(65) Prior Publication Data

US 2006/0007739 A1    Jan. 12, 2006

(30) Foreign Application Priority Data

May 18, 2004    (JP)    .............................. 2004-147829

(51) Int. Cl.
*G11C 29/00*    (2006.01)
(52) U.S. Cl. ................. 365/200; 365/201; 365/189.01; 365/189.06; 365/189.12
(58) Field of Classification Search ................ 365/200, 365/201, 189.01, 189.06, 189.12
See application file for complete search history.

(56) References Cited

U.S. PATENT DOCUMENTS 6,496,417 B1 * 12/2002 Shiau et al. ............. 365/185.2

2001/0024390 A1    9/2001    Fukuda
2004/0240249 A1    12/2004    Kuzuno et al.

FOREIGN PATENT DOCUMENTS

| JP | 2000-57795 | 2/2000 |
|----|------------|--------|
| JP | 2000-322898 | 11/2000 |
| JP | 2001-266589 | 9/2001 |
| JP | WO2002-037504 | 5/2002 |

* cited by examiner

*Primary Examiner*—Richard Elms
*Assistant Examiner*—Pho M. Luu
(74) *Attorney, Agent, or Firm*—Oblon, Spivak, McClelland, Maier & Neustadt, P.C.

(57) ABSTRACT

Data read out from each memory cell in a memory cell array is compared with an expected value by a comparator, and the quality of a memory cell is determined by performing program verify and erase verify. Based on the comparison result of the comparator, a detected defective cell is repaired by replacing it with a spare cell. Every time a defective cell is replaced with a spare cell, information on the defective cell is stored in a register, and whether a defective cell exists and whether the repair is possible are determined on the basis of the information. When the repair is possible, a control circuit is caused to execute control, and a detected defective cell is repaired by replacing it with a spare cell. When the repair is impossible, the defect repair stops.

9 Claims, 11 Drawing Sheets

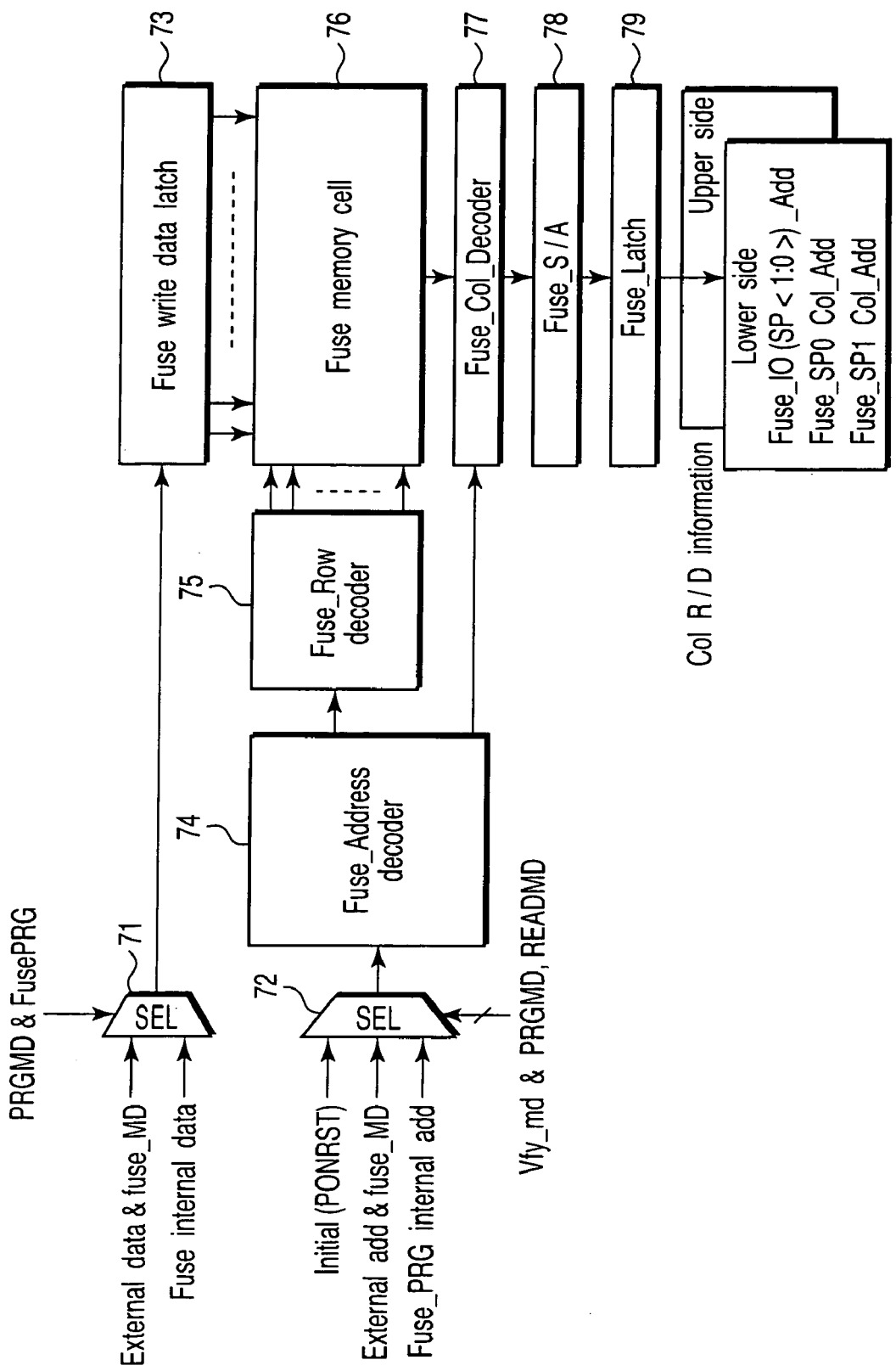
F I G. 4

SEMICONDUCTOR DEVICE AND TEST METHOD THEREOF

CROSS-REFERENCE TO RELATED APPLICATIONS

This application is based upon and claims the benefit of priority from the prior Japanese Patent Application No. 2004-147829, filed May 18, 2004, the entire contents of which are incorporated herein by reference.

BACKGROUND OF THE INVENTION

1. Field of the Invention

The present invention relates to a semiconductor device and test method therefor, and is applied to tests for, e.g., a memory equipped with a redundancy circuit and a memory-embedded microcomputer.

2. Description of the Related Art

Highly integrated semiconductor devices require a manufacturing process which adopts more advanced micropatterning. The efficiency percentage, i.e., yield of products sensitively depends on the presence of dust and dirt in the manufacturing process, variations in process, and the like. The percentage of complete nondefectives in which all bits are nondefective is naturally low for highly integrated memories. Under such a circumstance, the yield must be increased by a technique of preparing redundancy spare cells in addition to memory cells of a necessary capacity, and replacing a defective memory cell with a spare cell to repair the defective memory cell (see, e.g., Jpn. Pat. Appln. KOKAI Publication No. 2000-57795).

However, the cost of tests is high and occupies a large portion of the unit cost of a memory equipped with a redundancy circuit or a memory-embedded microcomputer. This is because the above-mentioned technique requires not only a time taken to test the function and reliability of a memory cell but also a function test for checking the function of the entire memory area including a defective cell repair redundancy circuit and a test for checking whether a defective cell can be repaired.

In general, after the manufacturing process of a memory ends, a function test is conducted on the initial stage. If a defective cell is detected, it is repaired by a redundancy circuit, and then the process advances to the next test step. The function test on the initial stage is done following, e.g., the next procedures.

Write/read and erase/read are executed at a high temperature for respective chips of a wafer having undergone the manufacturing process, and a fail bit map is created by a memory tester. The presence/absence of defective cells is determined on the basis of the fail bit map. If no defective cell exists, the chip is determined to be nondefective, and the process normally ends. If a defective cell exists, whether the repair is possible is determined on the basis of the fail bit map. If it is determined on this stage that the repair is impossible, the chip is determined to be a defective chip, and the test ends. If the repair is determined to be possible, the defective chip is repaired by replacing with a spare cell a defective cell at an address stored on the fail bit map. The function test is conducted again to check whether the replaced spare cell functions normally.

In the function retest, write/read and erase/read are executed at a high temperature in the above-described way, and a fail bit map is created by the memory tester. The presence/absence of defective cells is determined on the basis of the fail bit map. If no defective cell exists, the chip is determined to be nondefective, and the process normally ends. If a defective cell exists, whether the repair is possible is determined on the basis of the fail bit map. If the repair is determined to be impossible, the chip is determined to be a defective chip, and the test ends. If the repair is determined to be possible, the defective chip is repaired by replacing with a spare cell a defective cell at an address stored on the fail bit map. The function test is then conducted again.

This operation is repeated for memory cells at all addresses as far as spare cells remain. The chip quality can be determined, and a defective cell can be repaired by replacing it with a spare cell.

At this time, the problem lies in the memory function test and the redundancy replacement time. This test poses problems (1) to (4) because a fail bit map is created using the memory tester and the function test and redundancy replacement are executed on the basis of the fail bit map.

(1) In order to create a fail bit map using the memory tester, data must be written from the memory tester to a memory (chip) and read out from the chip to the memory tester. A long time is taken for data transfer between the chip and the tester. For a large-capacity memory, a large amount of data must be transferred from the tester and written, and a large amount of data must be read out and transferred to the tester. A long time is taken for the data transfer.

(2) The address width of a memory and its data width capable of read/write at once are determined by chip specifications, and the input/output data amount is limited. For example, to input/output 32-bit data to/from a chip capable of 8-bit external input/output, the data must be divided into four and separately read/written. As a result, the data read/write time becomes long.

(3) Creation of a fail bit map needs an expensive memory tester and complicated processes.

(4) A dedicated program is necessary for recognizing the address of a defective cell subjected to redundancy replacement on the basis of the fail bit map created by the memory tester.

As described above, the conventional semiconductor device and test method therefor suffer a long test time and high test cost. The rise in test cost is reflected in the cost of the semiconductor device, and increases the unit cost of the product.

BRIEF SUMMARY OF THE INVENTION

According to an aspect of the present invention, there is provided a semiconductor device comprising a main memory cell array in which memory cells are arrayed in a matrix, a spare cell to replace a defective cell in the main memory cell array, a comparator to compare data read out from each memory cell in the main memory cell array and an expected value and determine quality of the memory cell, a control circuit configured to control repair of a defective cell detected on the basis of a comparison result of the comparator by replacing the defective cell with the spare cell, a register which stores information on the defective cell, and a determination circuit configured to determine whether a defective cell exists and whether repair is possible, on the basis of the information stored in the register, when the repair is possible, cause the control circuit to perform the control and repair the detected defective cell by replacing the defective cell with the spare cell, and when the repair is impossible, set a flag and stop the defect repair.

According to another aspect of the present invention, there is provided a semiconductor device test method comprising the first step of executing at least one of program verify and erase verify of a memory cell, the second step of executing verify of a memory cell at a next address when the memory cell is determined by the verify to be a nondefective cell, the third step of storing information on the defective cell in a register when the memory cell is determined by the verify to be a defective cell, the fourth step of determining whether repair is possible, on the basis of the information on the defective cell that is stored in the register in the third step, when the repair is determined to be impossible, setting a flag and stopping operation, and when the repair is determined to be possible, executing verify of a memory cell at a next address, and the fifth step of repairing a defective cell in a main memory cell array on the basis of the information on the defective cell by replacing the defective cell with a spare cell.

BRIEF DESCRIPTION OF THE SEVERAL VIEWS OF THE DRAWING

FIG. 4 is a block diagram showing an example of the arrangement of a register which stores column redundancy information in the circuit shown in FIG. 3;

DETAILED DESCRIPTION OF THE INVENTION

Figure 1:
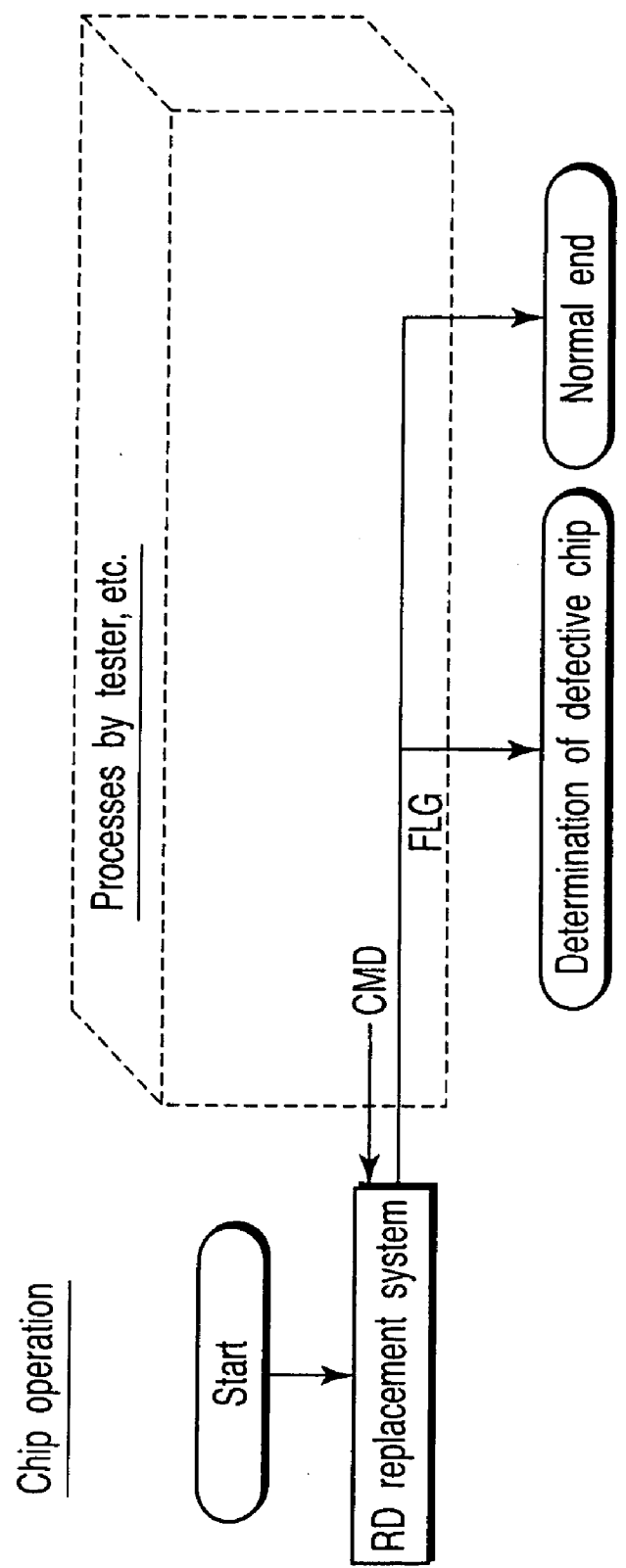
FIG. 1 is a schematic view showing the concept of a test in order to explain a semiconductor device and test method therefor according to embodiments of the present invention.

FIG. 1 is a schematic view showing the concept of a test in order to explain a semiconductor device and test method therefor according to embodiments of the present invention. The test is conducted for a wafer having undergone the manufacturing process. A command CMD is issued from a tester to a redundancy (RD) replacement system formed in each chip. A flag FLG representing the chip quality is read from each chip and confirmed to determine the chip quality.

More specifically, determination of whether the repair is possible, which has conventionally been done in the tester, is performed in the chip. The tester simply reads out, from each chip, the flag FLG representing the chip quality, and determines the chip quality. No fail bit map need be formed in the tester, various problems caused by determination of the chip quality on the basis of the fail bit map can be solved, and shortening of the test time and reduction of the test cost can be achieved. Reduction of the test cost leads to reduction of the unit cost of the semiconductor device.

Figure 2:
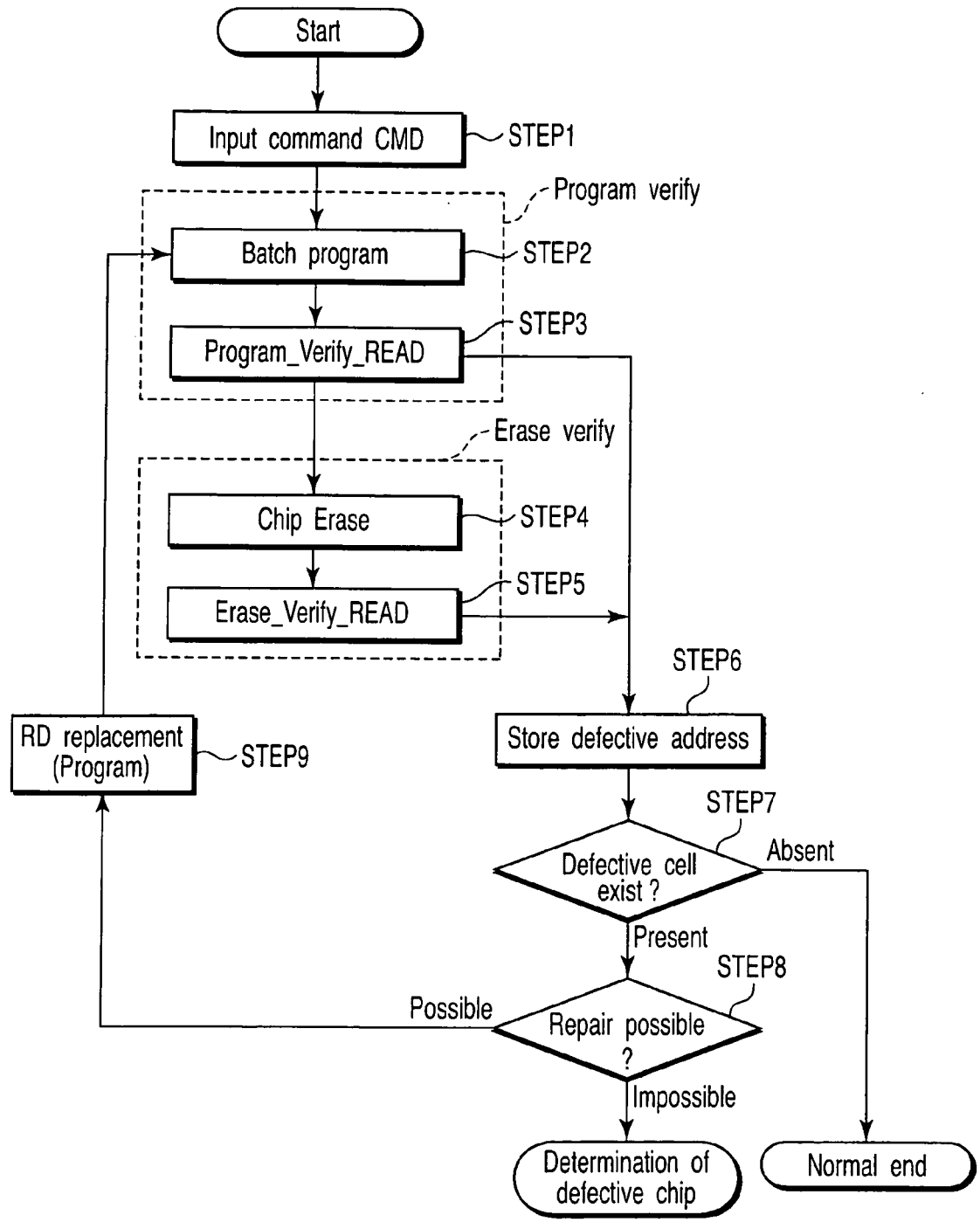
FIG. 2 is a flowchart showing intra-chip operation for implementing the arrangement and test as shown in FIG. 1.

FIG. 2 is a flowchart showing intra-chip operation for implementing the arrangement and test as shown in FIG. 1. When the command CMD for access to the RD replacement system is input to the chip (STEP 1), program verify starts. Program verify is executed by programming data at once (Batch Program) in the memory cell array (STEP 2) and performing program verify read (Program_Verify_READ) (STEP 3). By this process, it is confirmed whether data have normally been programmed in memory cells of the memory cell array. If a defective cell is detected (mismatch with an expected value), information on the detected defective cell, e.g., the defective address is stored in a register arranged in the chip (STEP 6).

Subsequently, erase verify is performed. Erase verify is executed by erasing (Chip Erase) data from memory cells in the memory cell array (STEP 4) and then performing erase verify read (Erase_Verify_READ) (STEP 5). By this process, it is confirmed whether data have normally been erased. If a defective cell is detected (mismatch with an expected value), information on the detected defective cell is stored in the register (STEP 6). For example, for a flash memory, the register is preferably formed using flash cells, similar to the memory cell array, but can also be implemented by a fuse circuit or the like.

After program verify and erase verify for all the addresses of the memory cell array end, the presence/absence of a defective cell is determined on the basis of defective cell information stored in the register (STEP 7). If no defective cell exists, the flow normally ends; if a defective cell exists, it is determined whether the defective cell can be repaired by the redundancy replacement system (redundancy circuit) (STEP 8). If the defective cell cannot be repaired by the redundancy circuit, the chip is determined to be a defective chip; if the defective cell can be repaired, a redundancy replacement (RD Replacement (Program)) process is executed (STEP 9). After the end of redundancy replacement, the flow returns to STEP 2 to perform program verify and erase verify and confirm that the defective cell has been replaced with a spare cell. In this manner, a defective cell is replaced with a spare cell while defective cell information is stored in the register. Determination results in STEP 7 and STEP 8 are stored as the flag FLG in a memory area ensured in the chip.

According to this arrangement and test method, whether the repair is possible is determined in the chip, and the tester can determine the chip quality by only reading out the flag FLG. Various problems caused by creating a fail bit map by the tester can be solved, and shortening of the test time and reduction of the test cost can be achieved.

Concrete examples of the arrangement of a semiconductor device for implementing the above-described operation, and test operation therefor will be described in more detail with reference to the first to third embodiments by exemplifying a flash memory.

FIRST EMBODIMENT

Figure 3:
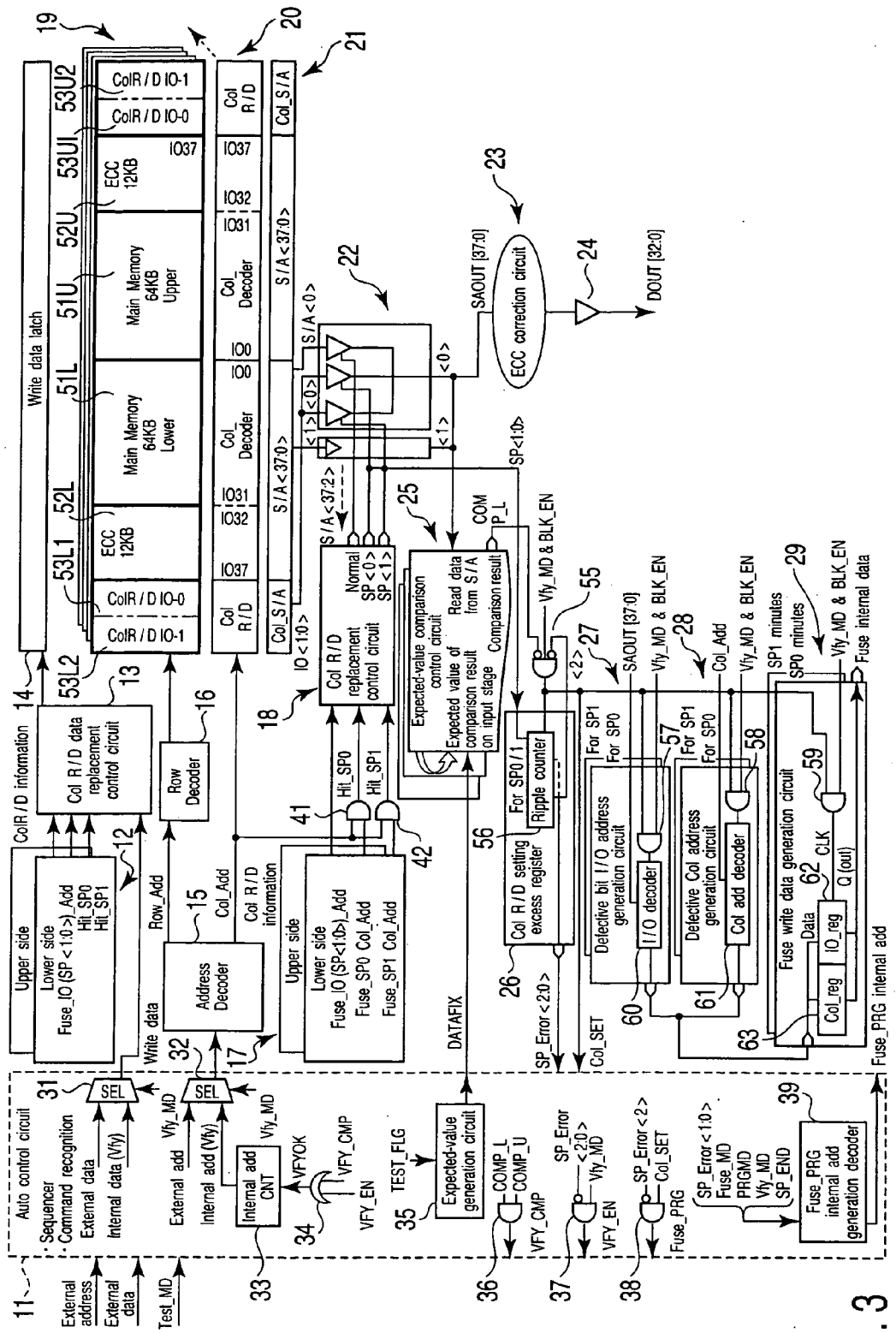
FIG. 3 is a block diagram showing the schematic arrangement of an extracted part of a circuit associated with redundancy by exemplifying a flash memory in order to explain a semiconductor device according to the first embodiment of the present invention.

FIG. 3 is a block diagram showing the schematic arrangement of an extracted part of a circuit associated with redundancy (redundancy replacement system) in order to explain a semiconductor device according to the first embodiment of the present invention. Column redundancy will be exemplified, and for descriptive convenience, two sets of spare cells are arranged on each of the upper and lower sides of a main memory cell array.

This circuit comprises an auto control circuit 11, a register 12 which stores pieces of column redundancy (Col R/D) information on the upper and lower sides, a column redundancy (Col R/D) data replacement control circuit 13, a write data latch 14, an address decoder 15, a row decoder 16, a register 17 which stores pieces of column redundancy information on the upper and lower sides, a column redundancy (Col R/D) replacement control circuit 18, a memory cell array 19, a column decoder (Col_Decoder) 20, a sense amplifier (S/A) 21, a buffer circuit 22, an ECC correction circuit 23, an output buffer 24, an expected-value comparison control circuit 25, a column redundancy setting excess register 26, a defective bit I/O address generation circuit 27, a defective column (Col) address generation circuit 28, a fuse write data generation circuit 29, and the like.

The auto control circuit 11 operates as a sequencer and to recognize a command. The auto control circuit 11 receives an external address signal (External Address), external data (External Data), a signal (Test_MD) which designates the test mode, and the like. The auto control circuit 11 comprises selectors (SELs) 31 and 32, an internal address counter (Internal Add CNT) 33, an OR gate 34, an expected-value generation circuit 35, AND gates 36, 37, and 38, a fuse program internal address generation decoder (Fuse_PRG Internal Add Generation Decoder) 39, and the like.

The selector 31 receives external data and verify internal data (Internal Data(Vfy)), and performs selection control on the basis of a signal Vfy_MD representing the verify mode. Write data selected by the selector 31 is supplied to the column redundancy data replacement control circuit 13. The column redundancy data replacement control circuit 13 receives pieces of column redundancy information on the lower and upper sides (signal Fuse_IO(SP<1:0>)_Add, signal Hit_SP0, and signal Hit_SP1) from the register 12. A signal output from the column redundancy data replacement control circuit 13 is supplied to the write data latch 14.

The OR gate 34 receives a verify enable signal VFY_EN, and a signal VFY_CMP output from the AND gate 36, and supplies to the internal address counter 33 a signal VFYOK representing that the verify result output from the OR gate 34 is a "match". The external address signal and a verify internal address signal (Internal Add(Vfy)) output from the internal address counter 33 are supplied to the selector 32. The selector 32 is controlled by the signal Vfy_MD, and the address of a selected signal is supplied to the address decoder 15.

A row address signal (Row_Add) generated by the address decoder 15 is supplied to the row decoder 16. A column address signal (Col_Add) generated by the address decoder 15 is supplied to the column decoder 20 and one input terminal of each of AND gates 41 and 42. The other input terminal of each of the AND gates 41 and 42 receives a Fuse_SP0 column address signal (Col_Add) and Fuse_SP1 column address signal (Col_Add) from the register 17 which stores column redundancy information. Signals Hit_SP0 and Hit_SP1 which are respectively output from the AND gates 41 and 42 and represent that spare cells are accessed, and a signal Fuse_IO(SP<1:0>)_Add output from the register 17 are supplied to the column redundancy replacement control circuit 18.

The memory cell array 19 comprises 64-kbit (KB) main memory cell arrays (Main Memories) 51L and 51U on the lower and upper sides, 12-kbit (KB) ECC circuit memory cell arrays 52L and 52U on the lower and upper sides, and column redundancy spare cell arrays (Col R/D IO-0, Col R/D IO-1, Col R/D IO-0, and Col R/D IO-1) 53L1, 53L2, 53U1, and 53U2.

The column decoder 20 has an arrangement corresponding to the memory cell array 19, and comprises 32-bit I/Os corresponding to the main memory cell arrays 51L and 51U, 6-bit I/Os corresponding to the ECC circuit memory cell arrays 52L and 52U, and 2-bit I/Os corresponding to the spare cell arrays.

The sense amplifier 21 includes 38 bits corresponding to each of pairs of the main memory cell arrays 51L and 51U and ECC circuit memory cell arrays 52L and 52U, and 2 bits corresponding to each spare cell array. A signal output from the sense amplifier 21 is supplied to the buffer circuit 22.

Output operation of the buffer circuit 22 is controlled by output signals Normal, SP<0>, and SP<1> from the column redundancy replacement control circuit 18. The signal Normal selects data read out from the main memory cell arrays 51L and 51U and the ECC circuit memory cell arrays 52L and 52U. The signals SP<0> and SP<1> select data read out from the spare cell arrays 53L1, 53L2, 53U1, and 53U2. A 38-bit signal SAOUT[37:0] output from the buffer circuit 22 is supplied to the ECC correction circuit 23, undergoes error correction, and is output as a 33-bit signal (read data) DOUT[32:0] via the output buffer 24.

Data output from the buffer circuit 22 is supplied to the expected-value comparison control circuit 25. The expected-value comparison control circuit 25 receives as an expected value a signal DATAFIX output from the expected-value generation circuit 35. The operation of the expected-value generation circuit 35 is controlled by a flag TEST_FLG representing the test state. A signal COMP_L which is output from the expected-value comparison control circuit 25 and represents a comparison result is inverted and supplied to the first input terminal of an AND gate 55. The second input terminal of the AND gate 55 receives a signal representing the verify mode and a block enable signal (Vfy_MD & BLK_EN), and the third input terminal of the AND gate 55 receives a signal output from a ripple counter 56 arranged in the column redundancy setting excess register 26. A signal output from the AND gate 55 is supplied to the ripple counter 56, the auto control circuit 11 (signal Col_SET), one input terminal of an AND gate 57 arranged in the defective bit I/O address generation circuit 27, one terminal of an AND gate 58 arranged in the defective column address generation circuit 28, and one input terminal of an AND gate 59 arranged in the fuse write data generation circuit 29. A column redundancy excess signal SP_Error<2:0> output from the column redundancy setting excess register 26 is supplied to the auto control circuit 11.

Signals COMP_L and COMP_U which are output from the expected-value comparison control circuit 25 and represent a comparison result are supplied to the AND gate 36 in the auto control circuit 11. The AND gate 36 outputs the signal VFY_CMP representing a verify comparison result. The signal SP_Error<2:0> output from the column redundancy setting excess register 26 is inverted and supplied to one input terminal of each of the AND gates 37 and 38. The other input terminal of the AND gate 37 receives the signal Vfy_MD representing the verify mode, and the AND gate 37 outputs the verify enable signal VFY_EN. The other input terminal of the AND gate 38 receives a signal Col_SET output from the AND gate 55, and the AND gate 38 outputs a fuse program signal Fuse_PRG.

The other input terminal of the AND gate 57 in the defective bit I/O address generation circuit 27 receives the signal Vfy_MD & BLK_EN, and a signal output from the AND gate 57 is supplied as a control signal to an I/O decoder 60. The I/O decoder 60 decodes the signal SAOUT[37:0] output from the buffer circuit 22, and supplies the decoding result to the fuse write data generation circuit 29.

The other input terminal of the AND gate 58 in the defective column address generation circuit 28 receives the signal Vfy_MD & BLK_EN, and a signal output from the AND gate 58 is supplied as a control signal to a column address decoder 61. The column address decoder 61 decodes the column address signal Col_Add output from the address decoder 15, and supplies the decoding result to the fuse write data generation circuit 29.

The other input terminal of the AND gate 59 in the fuse write data generation circuit 29 receives the signal Vfy_MD & BLK_EN, and a signal CLK output from the AND gate 59 is supplied as a control signal to an I/O register (IO_reg) 62 and column register (Col_reg) 63. The I/O register 62 stores an I/O address output from the defective bit I/O address generation circuit 27, and the column register 63 stores a column address output from the defective column address generation circuit 28. A signal Q(out) output from the I/O register 62 and column register 63 is supplied as fuse internal data to the registers 12 and 17 which store column redundancy information.

The fuse program internal address generation decoder 39 in the auto control circuit 11 receives the column redundancy excess signal SP_Error<1:0>, a signal Fuse_MD representing the fuse mode, a signal PRGMD representing the program mode, the signal Vfy_MD representing the verify mode, and a signal SP_END representing that no spare cell remains. Based on these signals, the fuse program internal address generation decoder 39 generates a fuse program internal address signal, and supplies it to the registers 12 and 17 which store column redundancy information.

FIG. 4 is a block diagram showing an example of the arrangements of the registers 12 and 17 which store column redundancy information in the circuit shown in FIG. 3. The registers 12 and 17 are separated for descriptive convenience in FIG. 3, but are formed from one register (memory) in FIG. 4. The register ANDs the column address signal and Fuse_SP0 column address signal (Col_Add) to generate the signal Hit_SP0 representing that a spare cell is accessed. The register ANDs the column address signal and Fuse_SP1 column address signal (Col_Add) to generate the signal Hit_SP1 representing that a spare cell is accessed.

The register comprises selectors (SELs) 71 and 72, a fuse write data latch 73, a fuse address decoder (Fuse_Address Decoder) 74, a fuse row decoder (Fuse_Row Decoder) 75, a fuse memory cell array (Fuse Memory Cell) 76, a fuse column decoder (Fuse_Col_Decoder) 77, a fuse sense amplifier (Fuse_S/A) 78, a fuse latch (Fuse_Latch) 79, and the like.

The selector 71 is controlled by the signals PRGMD and Fuse_PRG, selects external data, the signal Fuse_MD, or fuse internal data, and supplies the selected signal to the fuse write data latch 73.

The selector 72 is controlled by a signal Vfy_MD & PRGMD and a signal READMD representing the read mode, selects one of an initial setting signal Initial (e.g., power-on reset signal PONRST), an external address signal & Fuse_MD, and the Fuse_PRG internal address signal, and supplies the selected signal to the fuse address decoder 74.

The fuse address decoder 74 decodes the input address signal, generates a row address signal and column address signal, and supplies the row address signal to the fuse row decoder 75 and the column address signal to the fuse column decoder 77. The fuse row decoder 75 selects a word line in the fuse memory cell 76, whereas the fuse column decoder 77 selects a bit line in the fuse memory cell 76. The fuse memory cell 76 is called a fuse, and formed from a flash memory, similar to a memory cell in the memory cell array 19. Data from the fuse write data latch is written in a memory cell selected by the word line and bit line.

Data read out from the memory cell selected by the word line and bit line is supplied to the fuse sense amplifier 78, amplified by it, supplied to the fuse latch 79, and latched by it.

The data latched by the fuse latch 79, i.e., the signals Fuse_IO(SP<1:0>)_Add, signal Fuse_SP0 Col_Add, and signal Fuse_SP1 Col_Add on each of the lower and upper sides are used as column redundancy information.

Figure 5:
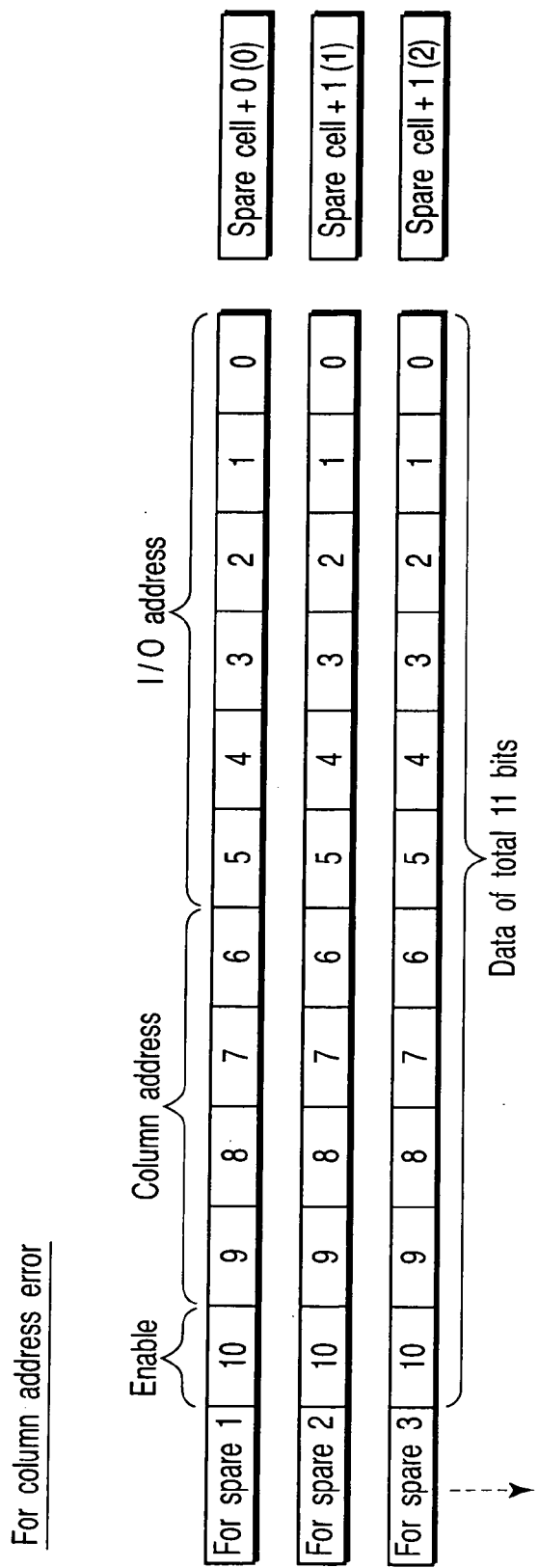
FIG. 5 is a view showing in detail the bit configuration of a fuse memory cell shown in FIG. 4.

FIG. 5 shows in detail the bit configuration of the fuse memory cell 76 shown in FIG. 4. As shown in FIG. 5, an I/O address, a column address, and an enable signal for designating whether to enable a spare cell are stored in correspondence with each spare cell. In this example, the I/O address is given by 6 bits 0 to 5, the column address is given by 4 bits 6 to 9, the enable signal is given by 1 bit of enable bit 10, and 11-bit data expresses defective cell information (address). In redundancy replacement, the flag is set for enable bit 10 of a spare cell corresponding to a defective cell, and an I/O address and column address are stored.

Figure 6:
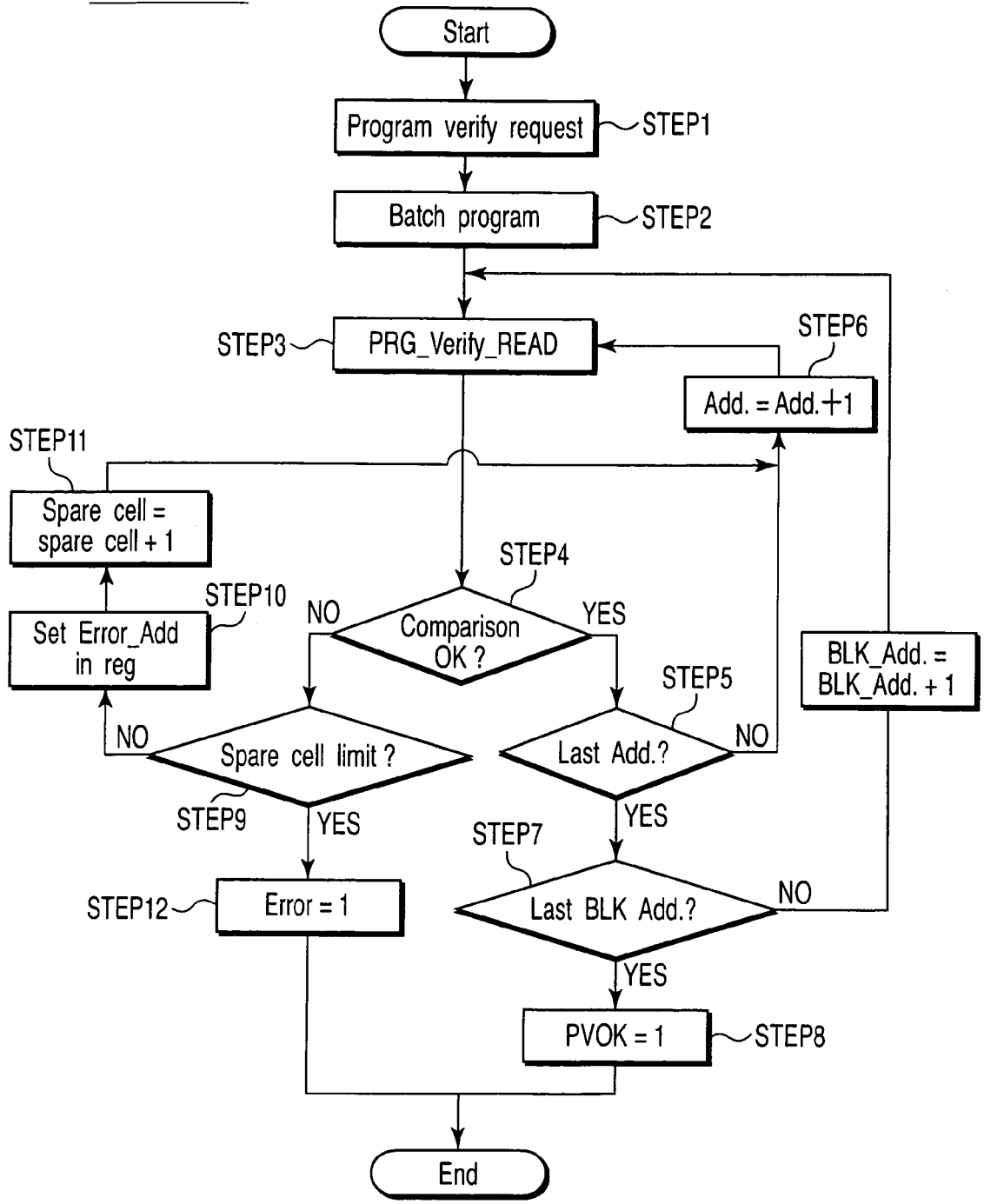
FIG. 6 is a flowchart showing program verify in column redundancy shown in FIGS. 1 to 4.
Figure 7:
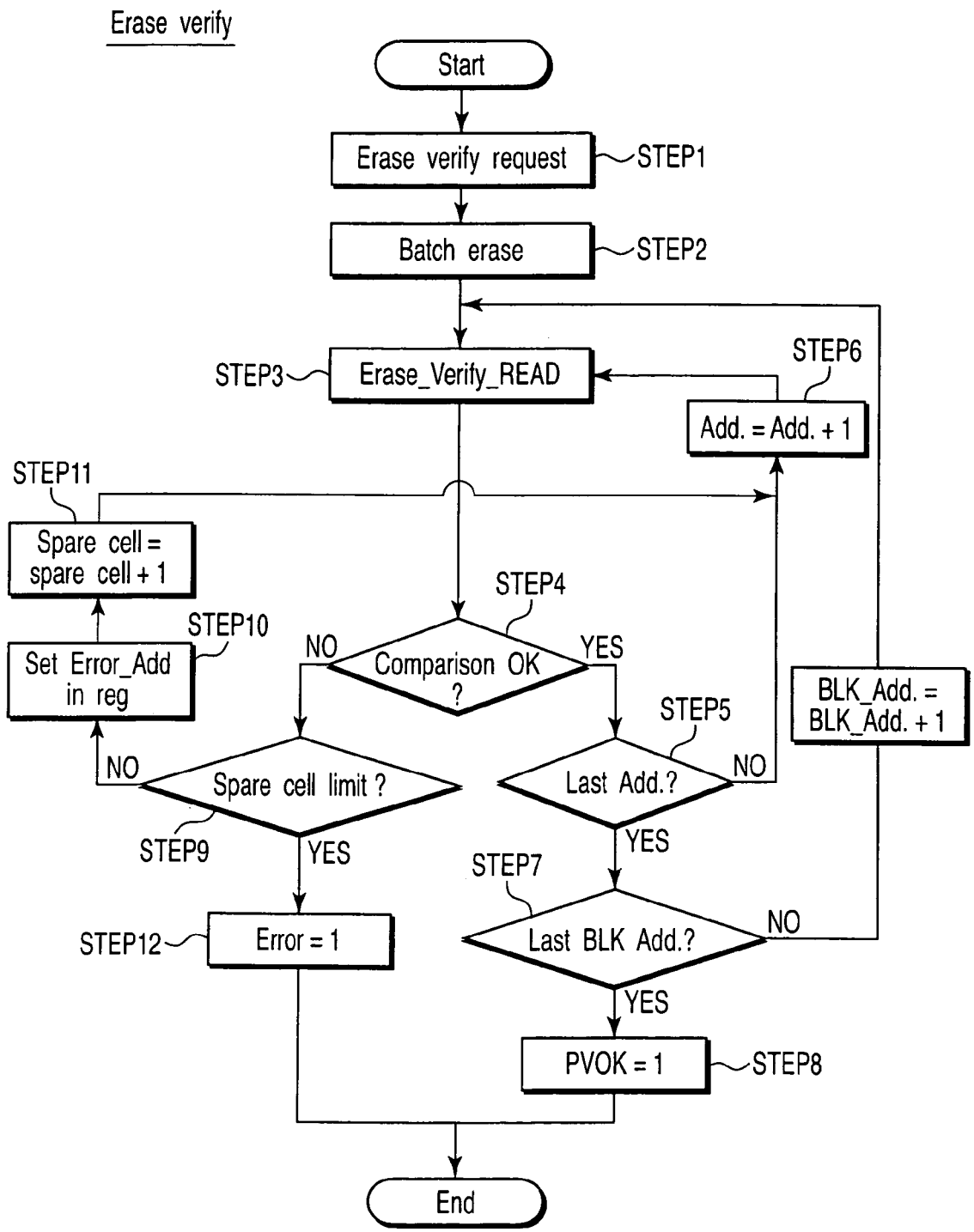
FIG. 7 is a flowchart showing erase verify in column redundancy shown in FIGS. 1 to 4.
Figure 8:
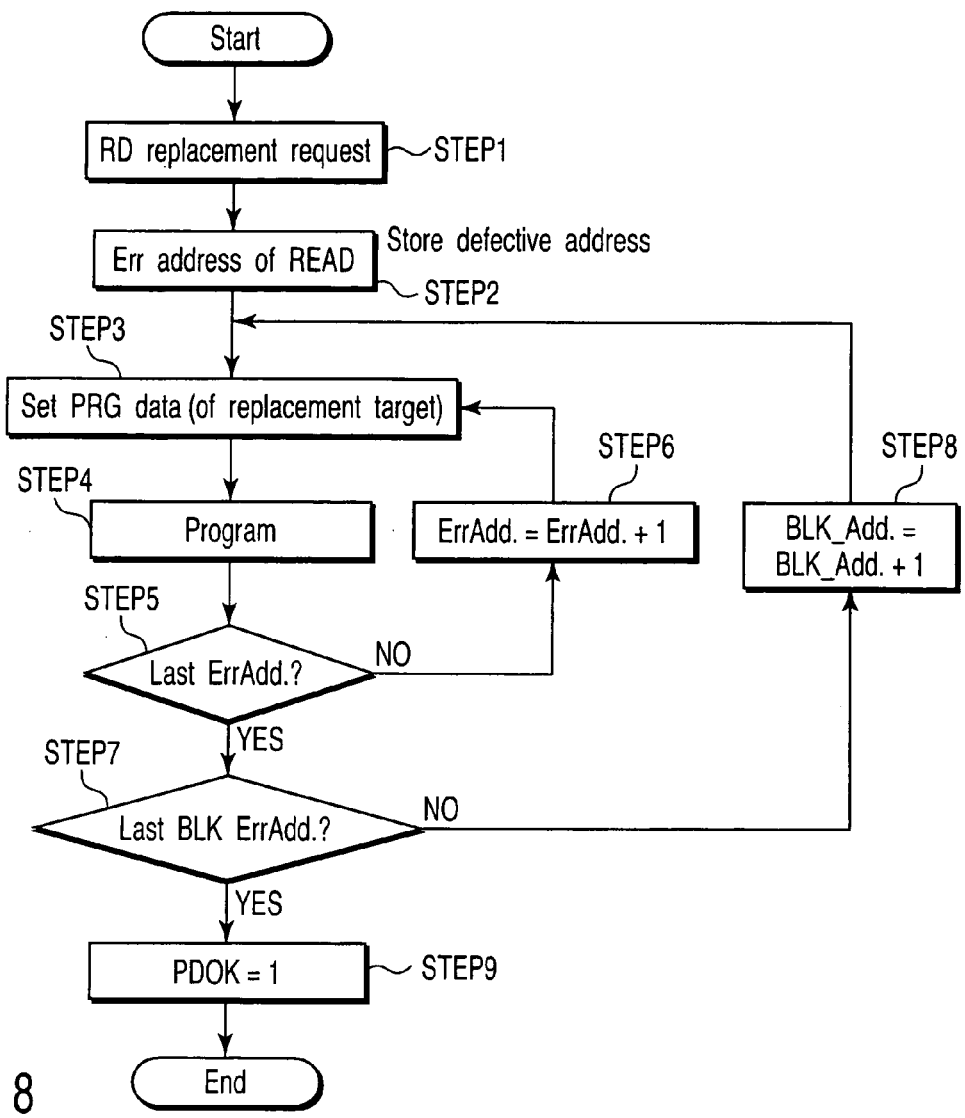
FIG. 8 is a flowchart showing redundancy replacement in column redundancy shown in FIGS. 1 to 4.

Operation in the above arrangement will be explained with reference to the flowcharts of FIGS. 6 to 8. FIG. 6 shows program verify in column redundancy operation, FIG. 7 shows erase verify, and FIG. 8 shows redundancy replacement (program).

As shown in FIG. 6, when a program verify request is issued (STEP 1), a batch program of test data is executed (STEP 2). Program verify in column redundancy is done in the program mode, the signal Vfy_MD representing the verify mode in the circuit shown in FIG. 3 is at "L" level, and the selectors 31 and 32 select external data (write data) and an external address (write address). The external data is supplied as write data to the write data latch 14 via the column redundancy data replacement control circuit 13, and the external address is decoded by the address decoder 15. A row address output from the address decoder 15 is decoded by the row decoder 16 to select a word line in the memory cell array 19 (for the batch data program, all word lines are selected). A column address is decoded by the column decoder 20 to select a bit line.

After the end of the program, program verify read (Program_Verify_READ) is executed (STEP 3). In the verify mode, the signal Vfy_MD changes to "H" level to set an initial address in the auto control circuit 11 (all addresses from the initial address). The selectors 31 and 32 select internal data (Internal Data(Vfy)) and an internal address (Internal Add(Vfy)). The internal address is supplied to the address decoder 15 and decoded, the row address signal is supplied to the row decoder 16 and decoded, and the column address signal is supplied to the column decoder 20 and decoded, thereby selecting a memory cell in the memory cell array 19.

Data read out from the selected memory cell is amplified by the sense amplifier 21, and supplied to the buffer circuit

22. In the buffer circuit 22, when the column of a defective cell is not accessed, data (read data) read out from the memory cell arrays 51L and 51U and the ECC circuit memory cell arrays 52L and 52U are selected by the signal Normal output from the column redundancy replacement control circuit 18.

The read data and program data undergo an expected-value comparison to determine whether they match each other (STEP 4). The expected-value comparison is achieved by comparing each bit of the data SAOUT[37:0] output from the buffer circuit 22 with the expected value (DATAFIX=PRG value) by the expected-value comparison control circuit (comparator) 25. The expected-value comparison control circuit 25 outputs the signal COMP_L representing the expected-value comparison result.

If the read data and program data match each other, it is determined whether the current address is the last one (STEP 5). If NO in STEP 5, the address is counted up (STEP 6), the flow returns to STEP 3 to perform program verify read, and the address in the same block is sequentially counted up and confirmed. That is, if read data matches the expected value, the signal VFYOK output from the OR gate 34 changes to "H" level, and the internal address counter 33 is counted up to increment the internal address supplied to the selector 32. If the current address is determined in STEP 5 to be the last address of the block, it is determined whether the current block address is the last one (STEP 7). If NO in STEP 7, the block address is counted up (BLK_Add.=BLK_Add.+1), the flow returns to STEP 3 to sequentially count up the address in the next block and confirm all memory cells in the block. The same operation is similarly repeated for all addresses in all blocks.

If the current block is determined to be the last one, the program is determined to be normal, the flag is set (PVOK=1), and the flow ends (STEP 8).

If mismatch between the read data and the program data is detected in STEP 4, it is determined whether the spare cell count is equal to or smaller than the spare cell limit value (STEP 9). If YES in STEP 9, defective cell information (I/O address, column address, and enable signal) is set in the fuse memory cell 76 shown in FIG. 4 (STEP 10), and the count of the spare cell limit value is incremented by "+1" (STEP 11). Then, the flow returns to STEP 6 to perform the same program verify for the next address. If the spare cell count is determined in STEP 9 to exceed the spare cell limit value, the current chip is determined to be a defective chip, the flag is set (Error=1), and the flow ends (STEP 12).

More specifically, when data read out from the sense amplifier 21 does not match the expected value, the ripple counter 56 on the SP0 side of the column redundancy setting excess register 26 is set. If both SP0 and SP1 have already been set, the column redundancy excess signal SP_Error is set to "1".

At the same timing, the signal SAOUT[37:0] output from the buffer circuit 22 is decoded by the I/O decoder 60 in the defective bit I/O address generation circuit 27, and the defective I/O address is stored in the I/O register 62 in the fuse write data generation circuit 29. Similarly, the column address is decoded by the defective column address generation circuit 28, and the defective column address is stored in the column register 63 in the fuse write data generation circuit 29. Further, fuse write data is generated.

If read data and the expected value mismatch each other, the ripple counter 56 is set in the column redundancy setting excess register 26, and then verify is repeated until the address reaches the last one. If mismatch is detected for the third time (the number of defective cells is detected to exceed the number of spare cells), the signal VFY_EN changes to "L" level, and the signal VFYOK changes to "L" level. The current chip is determined to be a defective chip, and test operation stops.

If verify normally ends, whether to perform column redundancy replacement is determined on the basis of the signal Fuse_PRG output from the AND gate 38. When the signal Fuse_PRG is at "L" level, no column redundancy replacement is executed (replacement has already been done). When the signal Fuse_PRG is at "H" level, the process shifts to a fuse program sequence for column redundancy replacement. In the fuse program sequence, fuse internal data is selected by the selector 71, set in the fuse write data latch 73, and programmed in a fuse (in this example, a flash memory) in the fuse memory cell 76.

After programming to the fuse, all data of the fuse memory cell 76 are read out via the fuse sense amplifier 78 and set in the fuse latch 79 to update column redundancy information.

The above expected-value comparison operation is repeated for the memory cells of all addresses in all blocks. Finally, the signal Fuse_PRG output from the AND gate 38 changes to "L" level, and program verify ends.

Erase verify is basically the same as program verify described above. More specifically, as shown in the flowchart of FIG. 7, when an erase verify request is issued (STEP 1), data of a chip are erased at once (STEP 2), and erase verify read (Erase_Verify_READ) is performed (STEP 3).

The read data and the expected value of erase are compared to determine whether they match each other (STEP 4). If the read data and expected value match each other, it is determined whether the current address is the last one (STEP 5). If NO in STEP 5, the address is counted up (STEP 6), the flow returns to STEP 3 to perform erase verify read, and the address in the same block is sequentially counted up and confirmed. If the current address is determined in STEP 5 to be the last address of the block, it is determined whether the current block address is the last one (STEP 7). If NO in STEP 7, the block address is counted up, and the flow returns to STEP 3 to sequentially count up the address in the next block and confirm all memory cells in the block. The same operation is similarly repeated for all addresses in all blocks.

If the current block is determined to be the last one, erase is determined to have been done normally, the flag is set (PVOK=1), and the flow ends (STEP 8).

If mismatch between the read data and the expected value of erase is detected in STEP 4, it is determined whether the spare cell count is equal to or smaller than the spare cell limit value (STEP 9). If YES in STEP 9, the address of a defective cell is set in the registers 62 and 63 (STEP 10), and the count of the spare cell limit value is incremented by "+1" (STEP 11). Then, the flow returns to STEP 6 to perform the same erase verify for the next address. If the spare cell count is determined in STEP 9 to exceed the spare cell limit, the current chip is determined to be a defective chip, the flag is set (Error=1), and the flow ends (STEP 12).

FIG. 8 is a flowchart showing redundancy replacement (Program). If a defective cell is found in the above-described program verify or erase verify and a redundancy (RD) replacement request is issued (STEP 1), an error address is read from the defective address storage registers 62 and 63 (STEP 2), and the data (fuse internal data) is set as program data to a spare cell subjected to replacement (STEP 3). After the program is executed (STEP 4), it is determined whether the error address is the last one (STEP 5). If NO in STEP 5, the error address is incremented by "+1" (STEP 6), and the flow returns to STEP 3 to set program data and execute the program. This redundancy replacement operation is repeated until the error address reaches the last one in the same block.

If the error address reaches the last one in the block, it is determined whether this error address is an error address of the last block (STEP 7). If NO in STEP 7, the block address is incremented by "+1" (STEP 8), and the flow returns to STEP 3 to set program data and execute the program. This redundancy replacement operation is repeated until the error address reaches the last one in the same block. Similarly, redundancy replacement is executed for each block until the block reaches the last one.

If the error address reaches the last error address of the last block, redundancy replacement is determined to have been done normally, the flag is set (RDOK=1), and the flow ends (STEP 9). The process advances to program verify and erase verify after redundancy replacement.

In program verify and erase verify after redundancy replacement, when columns having defective cells in the main memory cell arrays 51L and 51U and the ECC circuit memory cell arrays 52L and 52U are selected, replaced spare columns in the spare cell arrays 53L1, 53L2, 53U1, and 53U2 are selected by a signal SP<0> or SP<1> output from the column redundancy control circuit 18, and the same verify as that before redundancy replacement is performed.

According to the semiconductor device having the above arrangement and the test method, the I/O address and column address of a defective cell are stored in registers every replacement. In redundancy replacement, whether the repair is possible is determined in the chip by using the redundancy information, and the tester can determine the chip quality by only reading out the flag. No fail bit map need be created by the tester, and various problems caused by determining the chip quality can be solved, and shortening of the test time and reduction of the test cost can be implemented.

More specifically, effects (a) to (d) can be obtained.

(a) The data transfer time can be substantially omitted because no fail bit map need be created using the memory tester and no large capacity of data need be exchanged between the memory tester and the memory (chip).

(b) The address width and data width determined by chip specifications do no pose any limitation because data can be input/output using all sense amplifiers in the chip.

(c) A low-cost memory tester can be adopted because no fail bit map need be created, and the process can be simplified because it suffices to read out only the flag.

(d) No program dedicated to recognize the address of a defective cell is necessary because no fail bit map need be created.

A flash memory is generally equipped with a control circuit for performing complicated control. By using the function of the control circuit, the chip determines its quality, and complication of the circuit and the rise of the cost can be minimized (register is necessary).

SECOND EMBODIMENT

FIGS. 9 to 12 are views for explaining a semiconductor device and test method therefor according to the second embodiment of the present invention which assumes both column redundancy and block redundancy. A spare block is arranged in addition to a spare column. When defective cells in a wide range or many defective cells which cannot be repaired by column redundancy as described in the first embodiment are generated, these defective cells are repaired by redundancy of each block.

Figure 9:
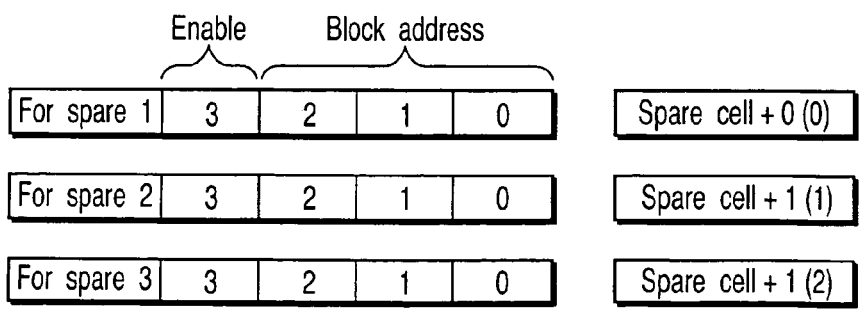
FIG. 9 is a view showing in detail the arrangement of a register which stores column redundancy information in order to explain a semiconductor device and test method therefor according to the second embodiment of the present invention.

In order to perform redundancy of each block (block redundancy), the semiconductor device according to the second embodiment comprises a block address error memory area as shown in FIG. 9 in addition to the arrangement as shown in FIGS. 3 to 5. The memory area stores the block address of each spare block and an enable signal for designating whether to enable the spare block. In this example, the block address is given by three bits 0 to 2, the enable signal is given by 1 bit of enable bit 3, and 4-bit data expresses the address of a defective block. In replacement by block redundancy, a flag is set at the enable bit of a spare block corresponding to a defective block, and the block address is stored.

The block redundancy memory area may be ensured separately from a column redundancy memory area, or may utilize a partial region of the fuse memory cell 76 shown in FIG. 4.

Figure 10:
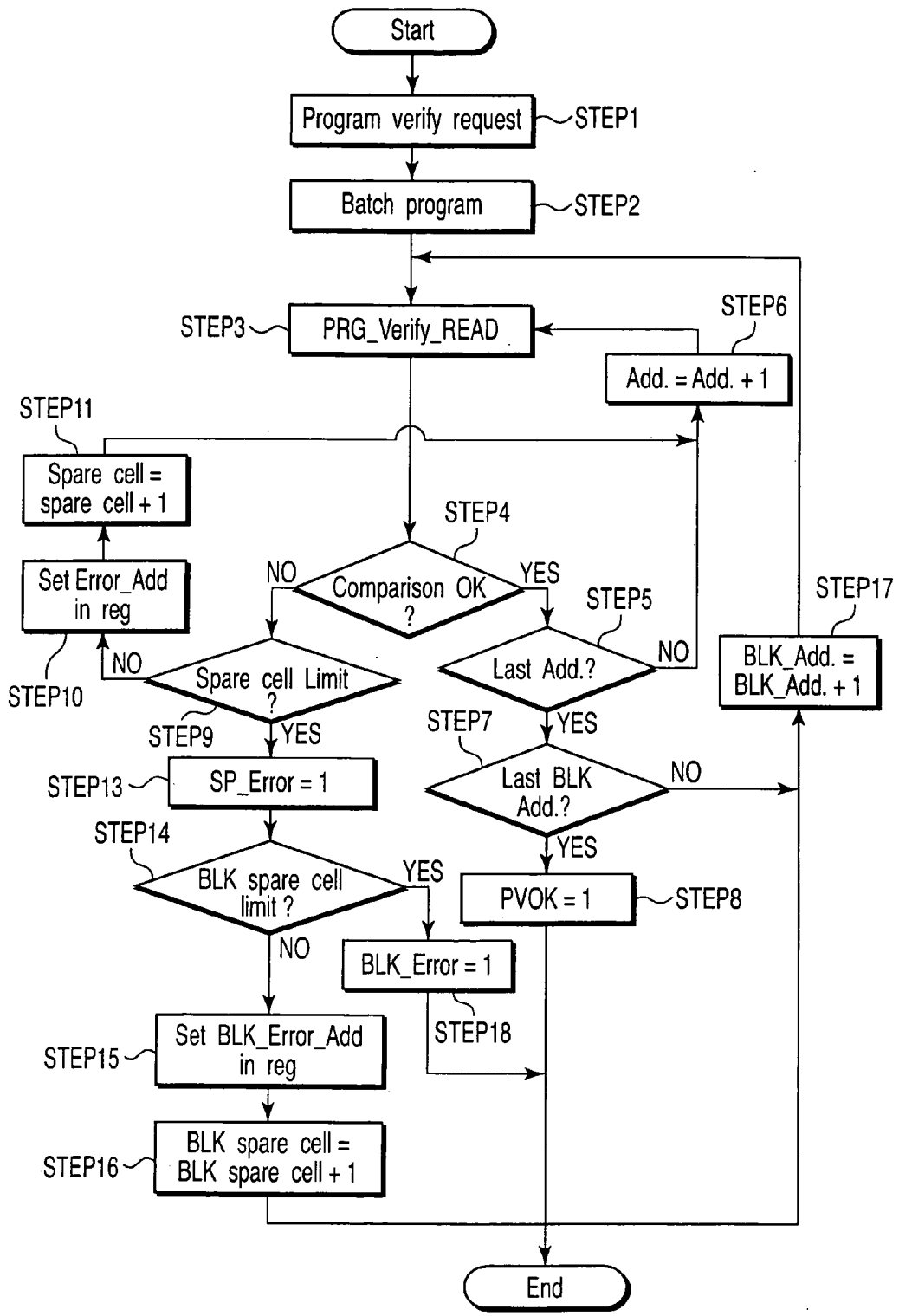
FIG. 10 is a flowchart showing program verify in the semiconductor device and test method therefor according to the second embodiment of the present invention.

FIG. 10 is a flowchart showing program verify in the semiconductor device having the above arrangement. The flow of the basic process is the same as that in FIG. 6, and only a difference will be explained.

In the first embodiment, when it is detected in STEP 9 that a chip has defective cells equal to or larger in number than the spare cell limit value, the chip is processed as a defective chip. In the second embodiment, such a chip is repaired by block redundancy.

More specifically, if a chip has defective cells equal to or larger in number than the spare cell limit value at which the repair is possible by column redundancy, the flag is set (SP_Error=1) (STEP 13). It is determined whether the number of defective cells is equal to or smaller than the spare block limit value (STEP 14). If YES in STEP 14, the address of an error block is set at the register shown in FIG. 9 (STEP 15), and the spare block count is incremented by "+1" (STEP 16). Then, the block address count is incremented by "+1" (STEP 17), and the flow advances to program verify of the next block.

If the number of defective cells is determined in STEP 14 to exceed the spare block limit value, the flag is set (BLK_Error=1), it is determined that the current chip cannot be repaired, and the flow ends (STEP 18).

Figure 11:
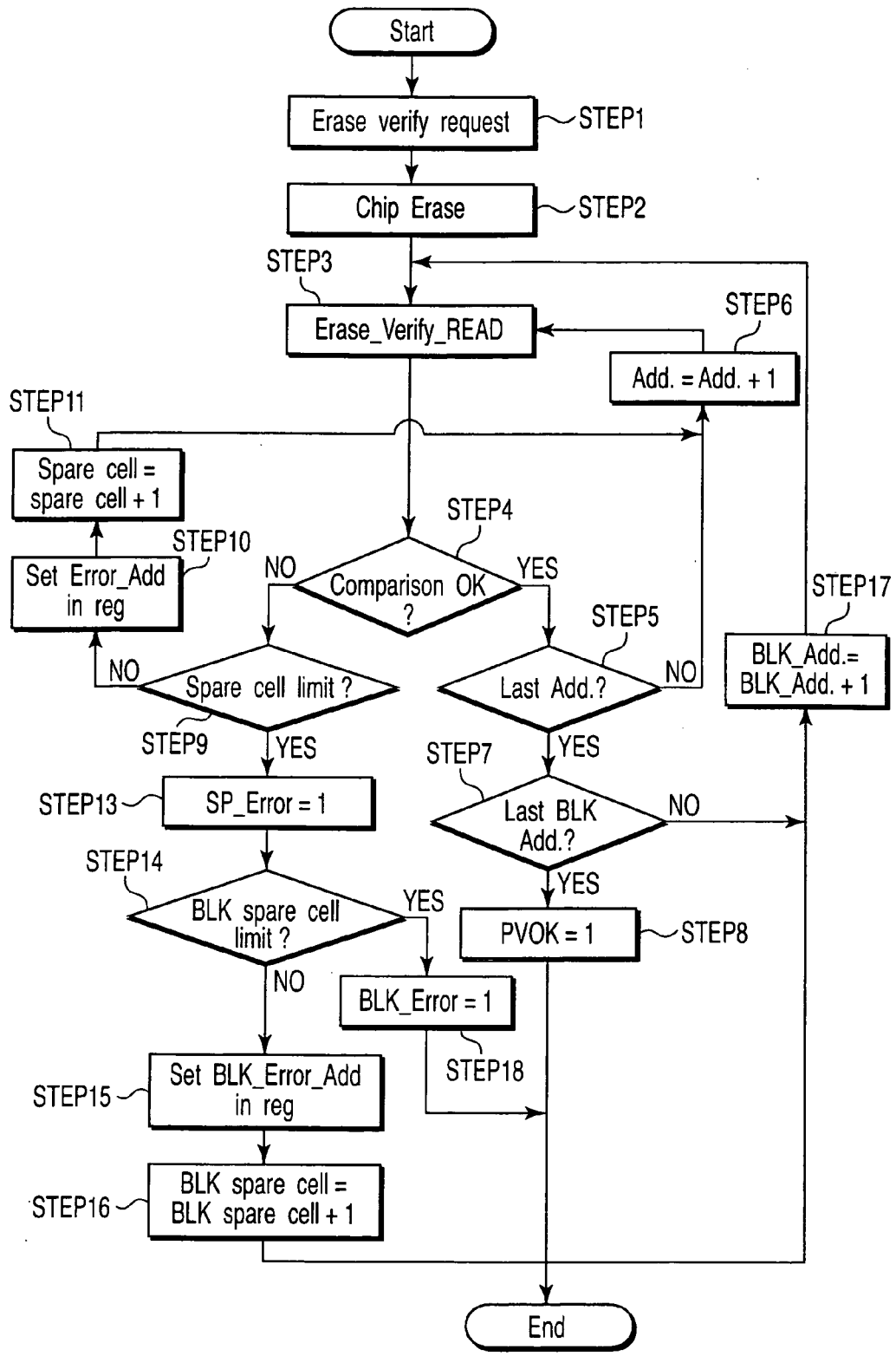
FIG. 11 is a flowchart showing erase verify in the semiconductor device and test method therefor according to the second embodiment of the present invention.

FIG. 11 is a flowchart showing erase verify. The flow of the basic process is also the same as that in FIG. 7, and only a difference will be explained.

More specifically, if a chip has defective cells equal to or larger in number than the spare cell limit value, the flag is set (SP_Error=1) (STEP 13). It is determined whether the number of defective cells is equal to or smaller than the spare block limit value (STEP 14). If YES in STEP 14, the address of an error block is set at the register shown in FIG. 9 (STEP 15), and the spare block count is incremented by "+1" (STEP 16). Then, the block address count is incremented by "+1" (STEP 17), and the flow advances to erase verify of the next block.

If the number of defective cells is determined in STEP 14 to exceed the spare block limit value, the flag is set (BLK_Error=1), it is determined that the current chip cannot be repaired, and the flow ends (STEP 18).

Figure 12:
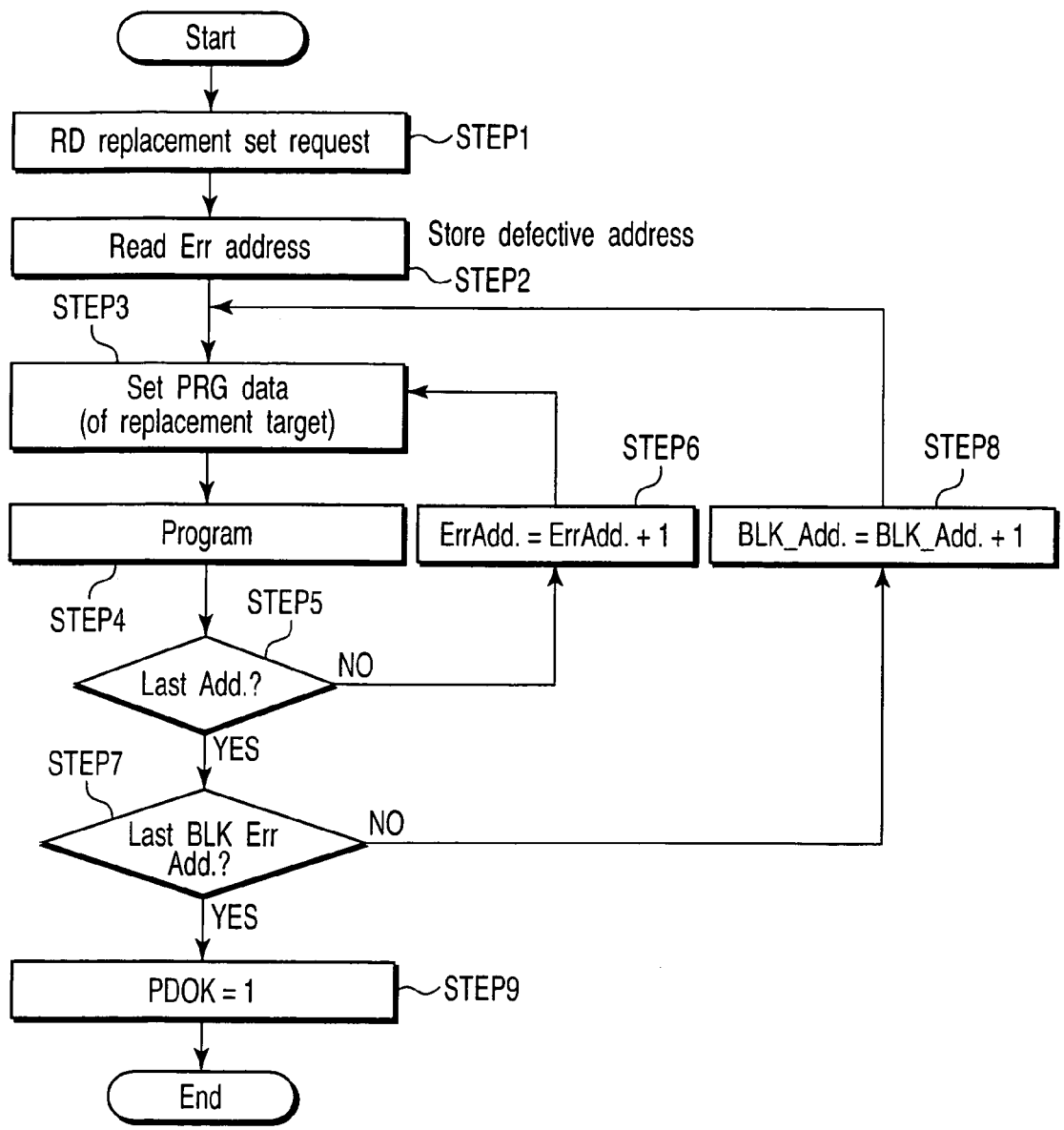
FIG. 12 is a flowchart showing redundancy replacement in the semiconductor device and test method therefor according to the second embodiment of the present invention.

FIG. 12 is a flowchart showing redundancy replacement. The flow of the basic process is also the same as that in FIG. 8, and a detailed description thereof will be omitted.

The semiconductor device having the above arrangement and the test method can attain substantially the same operation effects as those of the first embodiment. When many defective cells exist and cannot be repaired by only column redundancy, they can be repaired by block redundancy.

THIRD EMBODIMENT

The register is formed from a flash memory in the first and second embodiments, but may be formed from an aluminum fuse or polysilicon fuse. In this case, data must be programmed by irradiating the fuse with a laser beam or supplying a large current, and automatic redundancy replacement cannot be done, unlike a register formed from a flash memory. For this reason, defective cell information stored in the register is externally output, read into the memory tester, and used as a substitute for the fail bit map.

In the semiconductor device having this arrangement and the test method, the data amount transferred between the chip and the memory tester becomes larger than that in the first and second embodiments. However, the test time can be shortened, the test cost can be reduced, and also the cost of the semiconductor device can be reduced, in comparison with a case in which a fail bit map is created by the memory tester.

MODIFICATION

The first embodiment has described column redundancy, and the second embodiment has described column redundancy and block redundancy. Similarly, the present invention can also be applied to row redundancy, a combination of row redundancy and column redundancy, and a combination of row redundancy, column redundancy, and block redundancy.

As described above, the semiconductor device and test method therefor according to the embodiments of the present invention comprise unique arrangements and steps as described in (A) to (C).

(A) The address of a defective cell is automatically stored by a function check command (this corresponds to creation of a fail bit map).

(B) Redundancy replacement is automatically performed on the basis of information stored in (A) by a redundancy replacement command (when fuse information is stored in a nonvolatile memory such as a flash cell).

(C) When a chip has defective cells which exceed the allowable range of redundancy replacement in (A), the chip is determined to be defective which cannot be repaired, and a useless test is stopped.

With these features, no data need be exchanged between a chip and a test device such as a memory tester, and a defective chip can be screened by the function check on the initial stage. As a result, the total test cost can be greatly reduced, and the cost of the semiconductor device can also be reduced.

As has been described above, according to an aspect of the present invention, a semiconductor device capable of cost reduction by shortening the test time and reducing the test cost, and a test method therefor can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a main memory cell array in which memory cells are arrayed in a matrix;
   a spare cell to replace a defective cell in the main memory cell array;
   a comparator to compare data read out from each memory cell in the main memory cell array and an expected value and determine quality of the memory cell;
   a control circuit configured to control repair of a defective cell detected on the basis of a comparison result of the comparator by replacing the defective cell with the spare cell;
   a register which stores information on the defective cell; and
   a determination circuit configured to determine whether a defective cell exists and whether repair is possible, on the basis of the information stored in the register, when the repair is possible, cause the control circuit to perform the control and repair the detected defective cell by replacing the defective cell with the spare cell, and when the repair is impossible, set a flag and stop the defect repair.

2. A device according to claim 1, wherein the determination circuit comprises a first circuit unit which determines whether a defective cell exists, on the basis of the information on the defective cell that is stored in the register, and a second circuit unit which determines whether the repair is possible, on the basis of whether replacement of the defective cell with the spare cell exceeds a preset count.

3. A device according to claim 1, wherein the determination circuit sets the flag and stops the defect repair before qualities of all memory cells are determined when replacement of the defective cell with the spare cell exceeds a preset count.

4. A device according to claim 1, wherein the register stores the information on the defective cell every time the defective cell is replaced with the spare cell.

5. A device according to claim 1, wherein quality of a chip is determined by reading out the flag in a test.

6. A semiconductor device test method comprising:
   executing at least one of program verify and erase verify of a memory cell;
   executing verify of a memory cell at a next address when the memory cell is determined by the verify to be a nondefective cell;
   storing information on the defective cell in a register when the memory cell is determined by the verify to be a defective cell;
   determining whether repair is possible, on the basis of the information on the defective cell that is stored in the register by storing the information on the defective cell in the register, when the repair is determined to be impossible, setting a flag and stopping operation, and when the repair is determined to be possible, executing verify of a memory cell at a next address; and
   repairing a defective cell in a main memory cell array on the basis of the information on the defective cell by replacing the defective cell with a spare cell.

7. A method according to claim 6, further comprising externally outputting the information on the defective cell that is stored in the register.

8. A method according to claim 6, further comprising determining quality of a chip by externally inputting a command and reading out the flag.

9. A method according to claim 6, further comprising repeating, at all addresses in the main memory cell array, execution of at least one of program verify and erase verify of the memory cell, and the repair of the defective cell by replacing the defective cell with the spare cell.

* * * * *